(12) United States Patent
Sood et al.

(10) Patent No.: US 8,477,549 B1
(45) Date of Patent: Jul. 2, 2013

(54) TRIGGERED SENSE AMPLIFIER

(75) Inventors: Rohith Sood, Portland, OR (US); Zheng Chen, Upper Macungie, PA (US); Loren McLaury, Hillsboro, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 13 days.

(21) Appl. No.: 12/976,520

(22) Filed: Dec. 22, 2010

(51) Int. Cl.
*G11C 7/00* (2006.01)

(52) U.S. Cl.
USPC ............. 365/203; 365/154; 365/156; 326/38; 326/47

(58) Field of Classification Search
USPC ................ 326/37–41, 47; 365/154, 156, 203, 365/230.06; 257/903, E21.661, E27.098, 257/E27.099
See application file for complete search history.

(56) References Cited

U.S. PATENT DOCUMENTS

| | | | |
|---|---|---|---|
| 5,848,015 A | 12/1998 | Seno | |
| 5,936,905 A * | 8/1999 | Proebsting | 365/208 |
| 6,005,793 A * | 12/1999 | Tran | 365/154 |
| 6,714,464 B2 | 3/2004 | Bhatia et al. | |
| 7,116,585 B2 * | 10/2006 | Vernenker et al. | 365/189.05 |
| 7,295,481 B2 * | 11/2007 | Pille et al. | 365/203 |
| 7,352,647 B1 | 4/2008 | Saini | |
| 7,586,803 B2 | 9/2009 | Do | |
| 2008/0084781 A1 * | 4/2008 | Piorkowski | 365/233.1 |
| 2011/0110174 A1 * | 5/2011 | Cho et al. | 365/194 |

OTHER PUBLICATIONS

U.S. Appl. No. 12/976,412, Sood et al.

* cited by examiner

*Primary Examiner* — Jany Richardson (57) ABSTRACT

Techniques are provided which may be used to reduce power consumed by memory circuits. In one example, a programmable logic device (PLD) includes a plurality of static random access memory (SRAM) cells adapted to configure the PLD for an intended use. A pair of bitlines are connected to the SRAM cells. At least one of the SRAM cells is adapted to provide data signals to the bitlines in response to a wordline signal received by the one of the SRAM cells during a read operation. A sense amplifier is connected to the bitlines and adapted to detect a data value from the data signals in response to a trigger signal received by the sense amplifier during the read operation. Logic is adapted to delay the trigger signal relative to the wordline signal to permit the data signals to settle before the sense amplifier detects the data value.

21 Claims, 11 Drawing Sheets

TRIGGERED SENSE AMPLIFIER

TECHNICAL FIELD

The invention relates generally to electrical circuits and, more particularly, to the control of memory circuits.

BACKGROUND

Static random access memory (SRAM) is often implemented with many SRAM cells connected to shared bitlines. For example, in a programmable logic device (PLD) such as a field programmable gate array (FPGA), a complex programmable logic device (CPLD), a field programmable system on a chip (FPSC), or other type of programmable device, bitlines may connect many hundreds of SRAM cells distributed throughout the PLD. Such SRAM cells may be used, for example, to configure the PLD for operation.

SRAM implementations typically rely on asynchronous sense amplifiers which operate in a constant state of detection. As SRAM cells are read, differential signals on the bitlines are detected by the sense amplifiers and interpreted as data values. However, conventional sense amplifier implementations may be susceptible to error. For example, conventional sense amplifiers may detect and interpret incorrect data values in cases where the differential signals initially develop in the wrong direction, or where the differential signals are too small. Moreover, power may be wasted in such implementations where sense amplifiers are maintained in a constant state of detection and receive a current source routed to all sense amplifiers of a memory.

Accordingly, there is a need for an improved approach to the operation of sense amplifiers that increases accuracy and reduces the amount of wasted power associated with conventional implementations.

SUMMARY

In accordance with one embodiment of the invention, a programmable logic device (PLD) includes a plurality of static random access memory (SRAM) cells adapted to configure the PLD for an intended use; a pair of bitlines connected to the SRAM cells, wherein at least one of the SRAM cells is adapted to provide data signals to the bitlines in response to a wordline signal received by the one of the SRAM cells during a read operation; a sense amplifier connected to the bitlines and adapted to detect a data value from the data signals in response to a trigger signal received by the sense amplifier during the read operation; and logic adapted to delay the trigger signal relative to the wordline signal to permit the data signals to settle before the sense amplifier detects the data value.

In accordance with another embodiment of the invention, a method of operating a memory circuit of a programmable logic device (PLD) includes receiving a wordline signal during a read operation at a static random access memory (SRAM) cell of a plurality of SRAM cells adapted to configure the PLD for an intended use; providing data signals to a pair of bitlines from the SRAM cell in response to the wordline signal; delaying a trigger signal relative to the wordline signal; receiving the trigger signal at a sense amplifier during the read operation; and detecting a data value from the data signals using the sense amplifier in response to the trigger signal after the data signals have settled.

In accordance with another embodiment of the invention, a programmable logic device (PLD) includes means for storing a data value to configure the PLD for an intended use; means for passing data signals from the storing means in response to a wordline signal, wherein the passing means is connected to the storing means; means for delaying a trigger signal relative to the wordline signal; and means for detecting a data value from the data signals in response to the trigger signal after the data signals have settled.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the invention and their advantages are best understood by referring to the detailed description that follows. It should be appreciated that like reference numerals are used to identify like elements illustrated in one or more of the figures.

DETAILED DESCRIPTION

Figure 1:
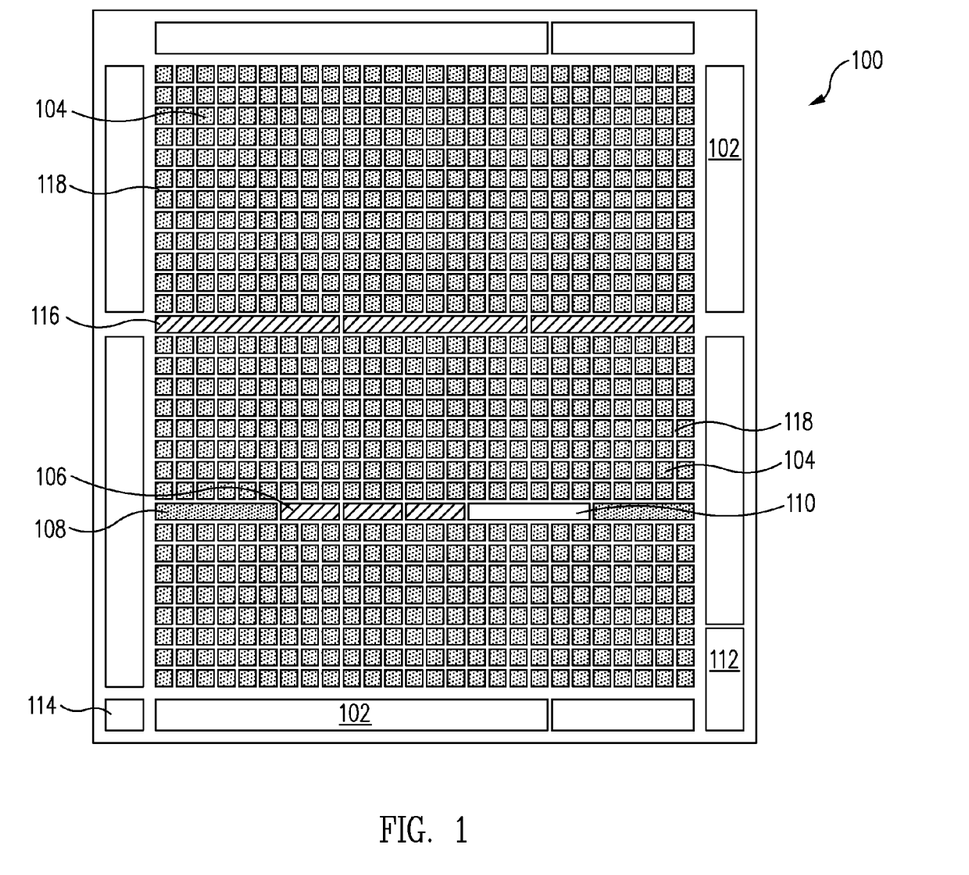
FIG. 1 illustrates a block diagram of a programmable logic device (PLD) in accordance with an embodiment of the invention.

FIG. 1 illustrates a block diagram of a programmable logic device (PLD) 100 in accordance with an embodiment of the invention. In various embodiments, PLD 100 may be implemented as a PLD in the XO2 family of devices available from Lattice Semiconductor Corporation of Hillsboro, Oreg.

PLD 100 (e.g., a field programmable gate array (FPGA), a complex programmable logic device (CPLD), a field programmable system on a chip (FPSC), or other type of programmable device) generally includes input/output (I/O) blocks 102 and logic blocks 104 (e.g., also referred to as programmable logic blocks (PLBs), programmable functional units (PFUs), or programmable logic cells (PLCs)). I/O blocks 102 provide I/O functionality (e.g., to support one or more I/O and/or memory interface standards) for PLD 100, while programmable logic blocks 104 provide logic functionality (e.g., LUT-based logic or logic gate array-based logic) for PLD 100.

PLD 100 may also include blocks of memory 106 (e.g., blocks of EEPROM, block SRAM, and/or flash memory), clock-related circuitry 108 (e.g., PLL and/or DLL circuits), configuration logic 110 (e.g., for startup, decryption, encryption, multiple-boot support (e.g., dual boot support), and/or error detection), a configuration port 112, configuration memory 114, special function blocks 116 (e.g., digital signal processing (DSP) blocks or other forms of multiply and accumulate circuit functionality), and/or routing resources 118. In general, the various elements of PLD 100 may be used to perform their intended functions for the desired application, as would be understood by one skilled in the art.

For example, configuration port 112 may be used for programming PLD 100, such as memory 106 and/or configuration memory 114 or transferring information (e.g., various types of data and/or control signals) to/from PLD 100 as would be understood by one skilled in the art. For example, configuration port 112 may include a first programming port (which may represent a central processing unit (CPU) port, a peripheral data port, an SPI interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). Configuration port 112 typically, for example, may be included to receive configuration data and commands to support serial or parallel device configuration and information transfer.

It should be understood that the number and placement of the various elements, such as I/O blocks 102, logic blocks 104, memory 106, clock-related circuitry 108, configuration logic 110, configuration port 112, configuration memory 114, special function blocks 116, and routing resources 118, are not limiting and may depend upon the desired application. For example, special function blocks 116 are optional and various other elements may not be required for a desired application or design specification (e.g., for the type of programmable device selected).

Furthermore, it should be understood that the elements are illustrated in block form for clarity and that certain elements, such as for example configuration memory 114 or routing resources 118, would typically be distributed throughout PLD 100, such as in and between logic blocks 104, to perform their conventional functions (e.g., storing configuration data that configures PLD 100 or providing interconnect structure within PLD 100, respectively). It should also be understood that the various embodiments of the invention as disclosed herein are not limited to programmable logic devices, such as PLD 100, and may be applied to various other types of programmable devices, as would be understood by one skilled in the art.

Figures 2, 2C:
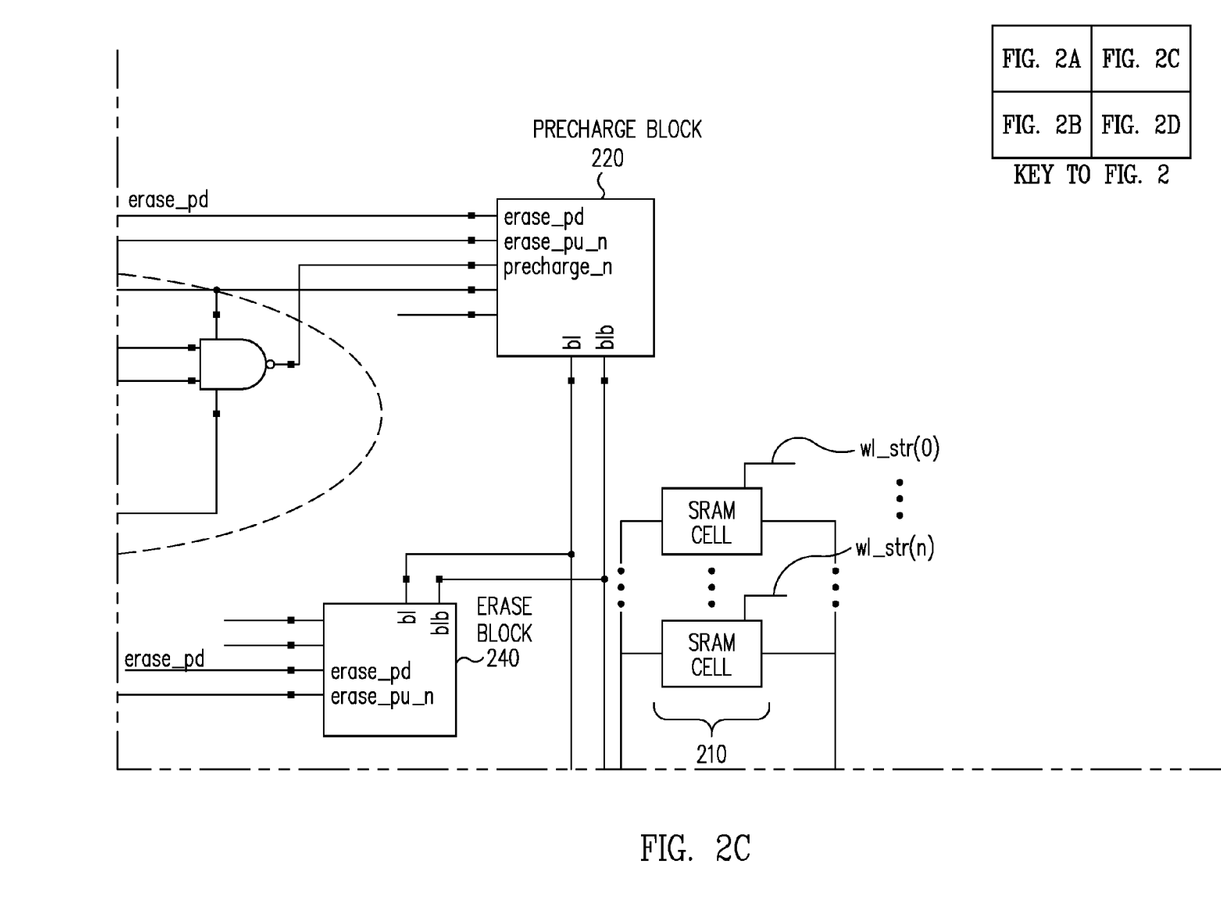
FIG. 2 illustrates memory control circuitry in accordance with an embodiment of the invention.
Figure 2A:
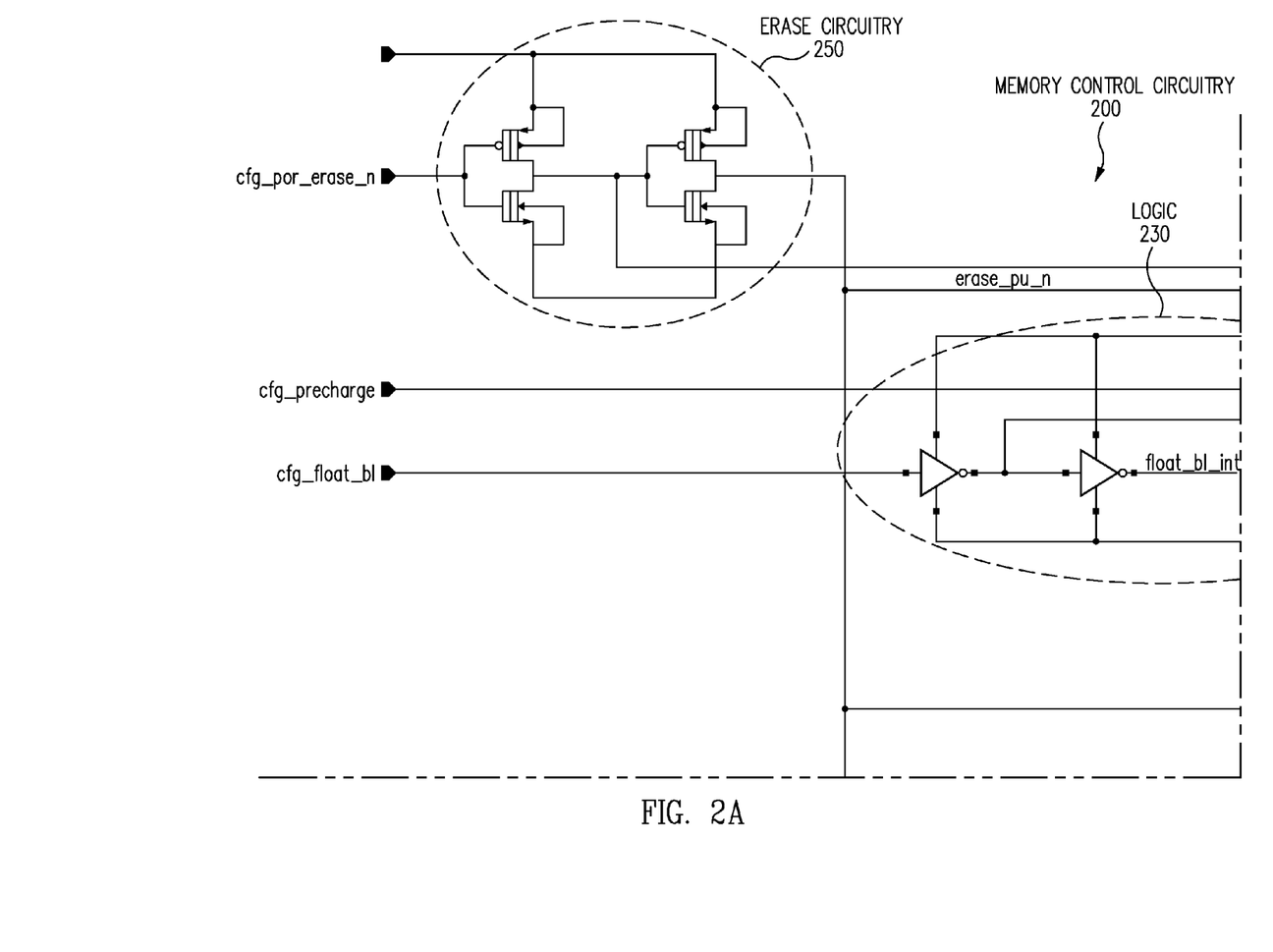
Figure 2B:
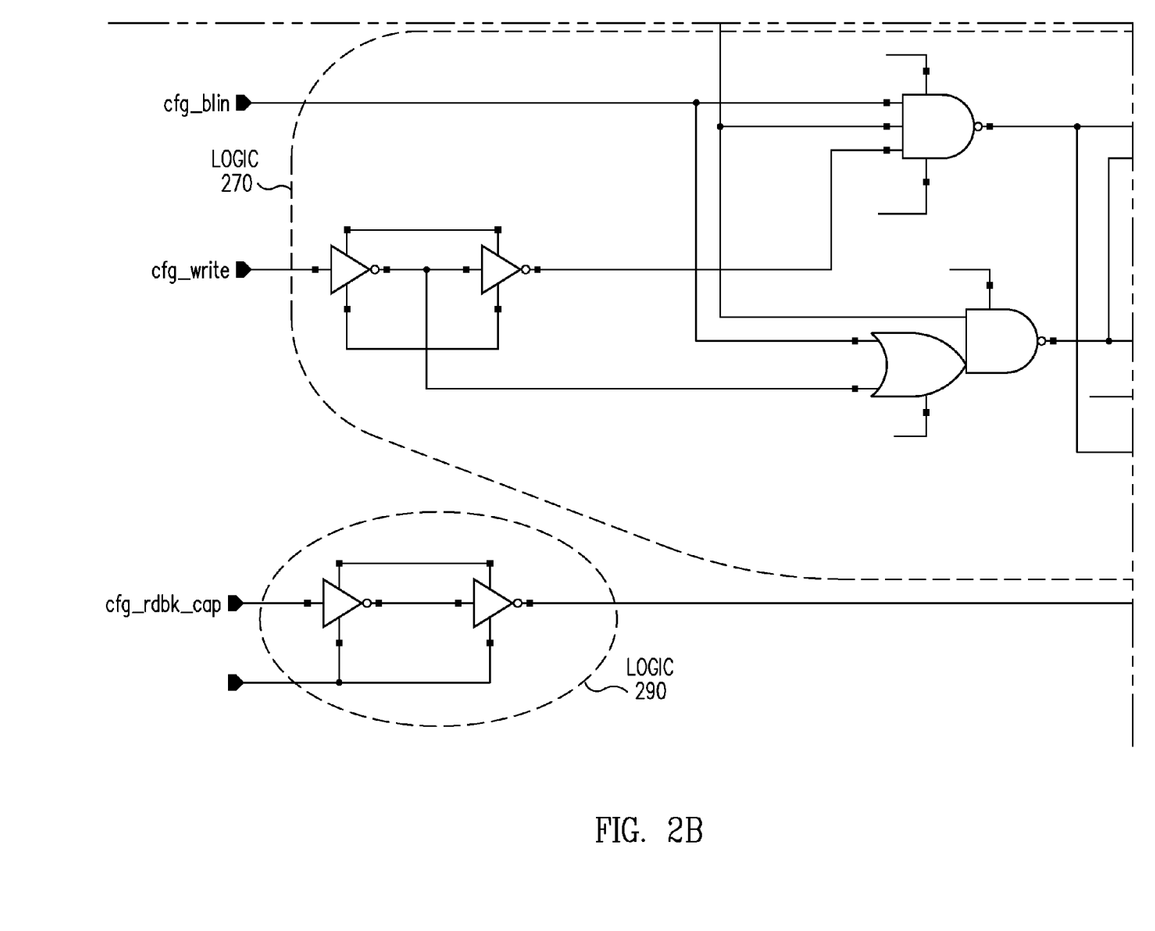
Figure 2D:
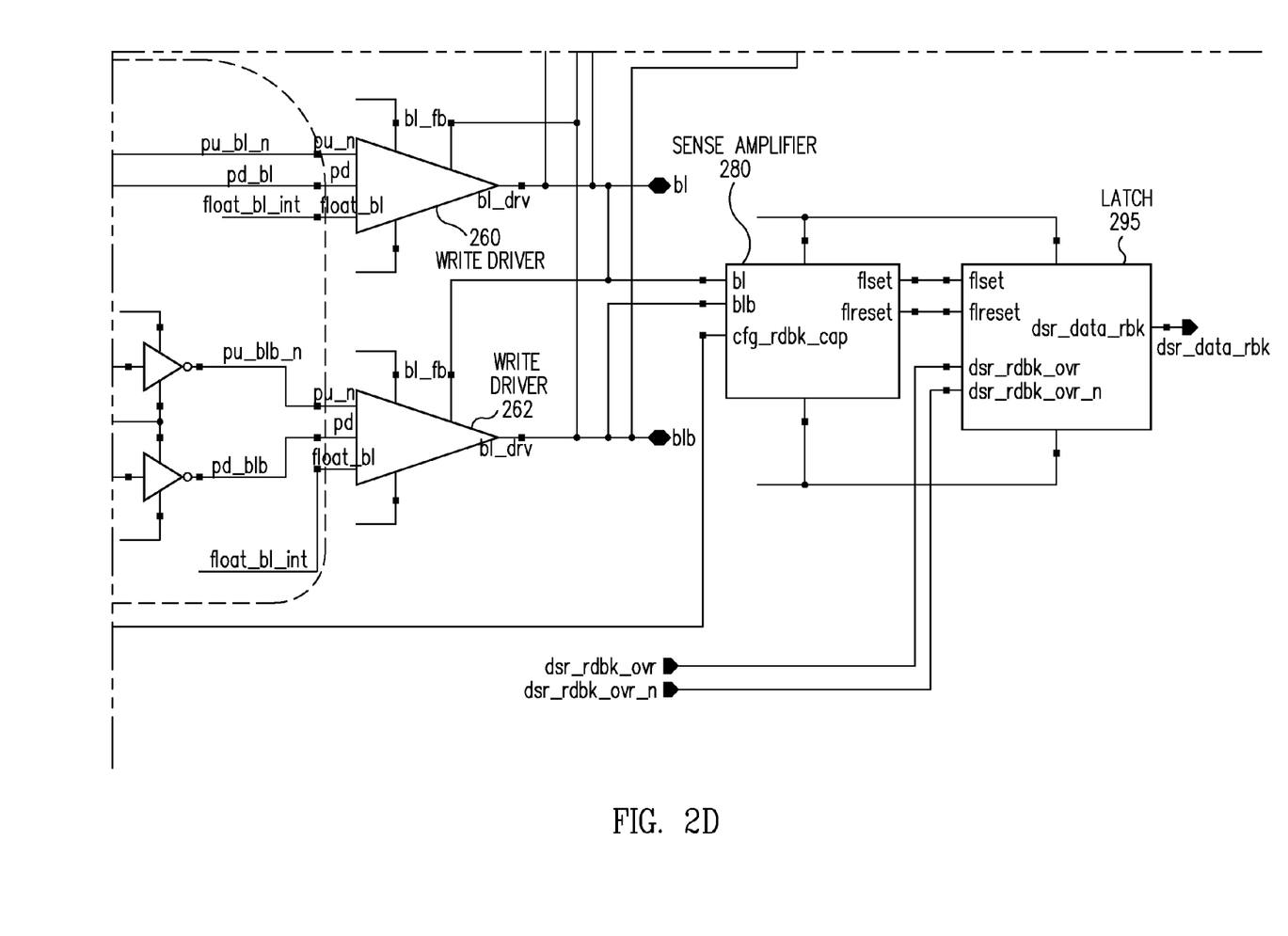

FIG. 2 illustrates memory control circuitry 200 in accordance with an embodiment of the invention. In one embodiment, memory control circuitry 200 may be implemented as part of a data shift register provided by, for example, configuration logic 110 of PLD 100. Memory control circuitry 200 includes a precharge block 220, logic 230, an erase block 240, erase circuitry 250, write drivers 260 and 262, logic 270, a sense amplifier 280, logic 290, and a latch 295 to collectively provide a memory circuit.

In various embodiments, PLD 100 may include means (e.g., one or more SRAM cells 210) for storing a data value, such as to configure PLD 100 for an intended use. PLD 100 may also include means (e.g., bitlines bl and blb) for passing data signals to and from the storing means, such as in response to a wordline signal. PLD 100 may also include means (e.g., precharging block 220 and precharging circuit 300 (shown in FIG. 3)) for precharging the passing means immediately prior to a read operation performed on the storing means and during a write operation performed on the storing means. PLD 100 may also include means (e.g., logic 230, precharging block 220 and precharging circuit 300) for floating the passing means relative to the precharging means during a power saving mode of operation, during a read operation performed on the storing means, and during a write operation performed on the storing means. PLD 100 may also include means (e.g., configuration logic 110 and logic 290) for delaying a trigger signal relative to the wordline signal. PLD 100 may also include means (e.g., sense amplifier 280) for detecting a data value from the data signals in response to the trigger signal after the data signals have settled to final values.

As shown in FIG. 2, memory control circuitry 200 is connected to a plurality of SRAM cells 210 through bitlines bl and blb (e.g., a pair of bitlines). In one embodiment, SRAM cells 210 may be implemented as part of any of the various memories of PLD 100 such as, for example, memory 106 and/or configuration memory 114. In one embodiment, SRAM cells 210 may be distributed throughout PLD 100. Accordingly, bitlines bl and blb may also be distributed throughout PLD 100.

In various embodiments, SRAM cells 210 may be implemented using any desired configuration such as a conventional six transistor configuration (e.g., with two access transistors and four transistors providing cross-coupled inverters) or any other desired configuration. In one embodiment, SRAM cells 210 may be implemented in an array of multiple columns (e.g., with each column having an associated set of bitlines bl and blb) and multiple rows (e.g., n+1 rows each having an associated wordline receiving a wordline signal wl_str used to strobe a row of SRAM cells 210). In one embodiment, each of bitlines bl and blb may be connected to 888 SRAM cells 210.

Although one column and n+1 rows of SRAM cells 210 are shown in FIG. 2, any desired number of columns and rows may be provided in other embodiments. In this regard, additional iterations of the various components of memory control circuitry 200 may be provided as desired to control additional SRAM cells 210 and additional pairs of bitlines bl and blb. For example, one or more additional sense amplifiers 280, logic 290, and latches 295 may be provided to detect data from additional pairs of bitlines bl and blb connected to additional SRAM cells 210.

Various portions of memory control circuitry 200 will now be described in further detail with regard to various signals identified in FIG. 2 which may be provided, for example, by other portions of configuration logic 110 of PLD 100.

Precharge block 220 includes a precharge circuit that operates to selectively precharge bitlines bl and blb (e.g., to a voltage of approximately 1.2 V in one embodiment) immediately prior to read or write operations on SRAM cells 210, and float relative to bitlines bl and blb at other times during and after read and write operations (e.g., bitlines bl and blb are not actively pulled up or down in voltage by the precharge circuit during and after read and write operations). Such selective precharging or floating may performed in response to various signals shown in FIG. 2.

For example, as shown in FIG. 2, precharge block 220 receives signals erase_pd, erase_pu_n, and precharge_n. Erase circuitry 250 provides signals erase_pd and erase_pu_n to precharge block 220 and erase block 240 in response to signal cfg_por_erase_n. In this regard, it will be appreciated that erase circuitry 250 provides logic (e.g., two inverters in one embodiment) such that signal erase_pu_n corresponds to signal cfg_por_erase_n, and signal erase_pd corresponds to the complement of signal cfg_por_erase_n.

Logic 230 provides signal precharge_n (e.g., a float control signal for precharge block 220) and signal float_bl_int (e.g., a float control signal for write drivers 260/262) in response to signals cfg_precharge and cfg_float_bl in accordance with the following Table 1:

TABLE 1

| cfg_precharge | cfg_float_bl | precharge_n | float_bl_int |
|---|---|---|---|
| 0 | 0 | 1 | 0 |
| 0 | 1 | 1 | 1 |
| 1 | 0 | 0 | 0 |
| 1 | 1 | 1 | 1 |

Figure 3:
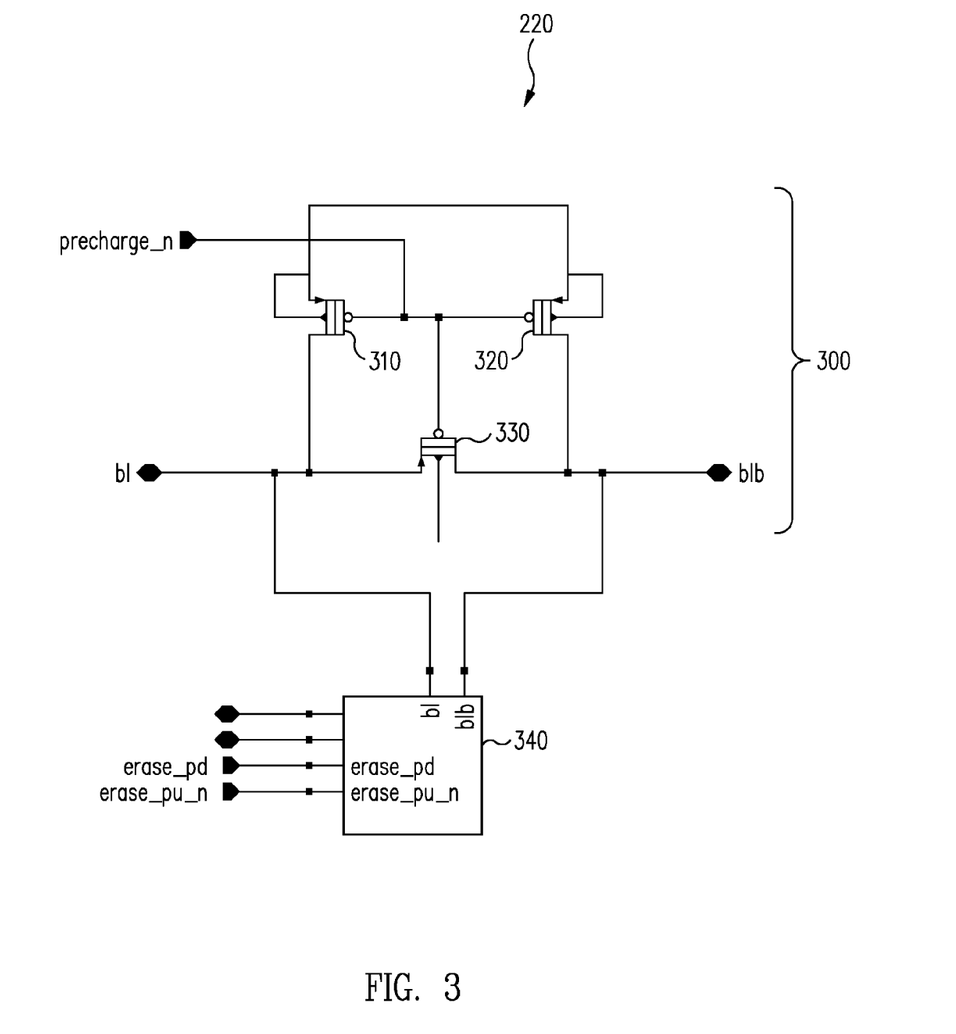
FIG. 3 illustrates a circuit implementation of a precharge block in accordance with an embodiment of the invention.

FIG. 3 illustrates a circuit implementation of precharge block 220 in accordance with an embodiment of the invention. Precharge block 220 includes a precharge circuit 300 including transistors 310, 320, and 330 that receive signal precharge_n and are connected to bitlines bl and blb.

When signal precharge_n is set to a logic low value (e.g., for a read or write operation performed on SRAM cells 210), transistors 310, 320, and 330 turn on to precharge bitlines bl and blb.

However, when signal precharge_n is set to a logic high value, transistors 310, 320, and 330 turn off to allow bitlines bl and blb to float. Thus, the overall power consumed by precharge block 220 may be reduced.

Precharge block 220 also includes an erase block 340 which may be implemented in the manner of erase block 240 to supplement the operation of erase block 240 as further described herein. Erase block 240 (shown in FIG. 2) and erase block 340 (shown in FIG. 3) operate to pull down bitline bl and pull up bitline blb as part of an erase operation (e.g., a bulk erase operation or otherwise) that may be performed on SRAM cells 210. Such an erase operation may be performed, for example, as part of a power on reset operation of PLD 100.

Figure 4:
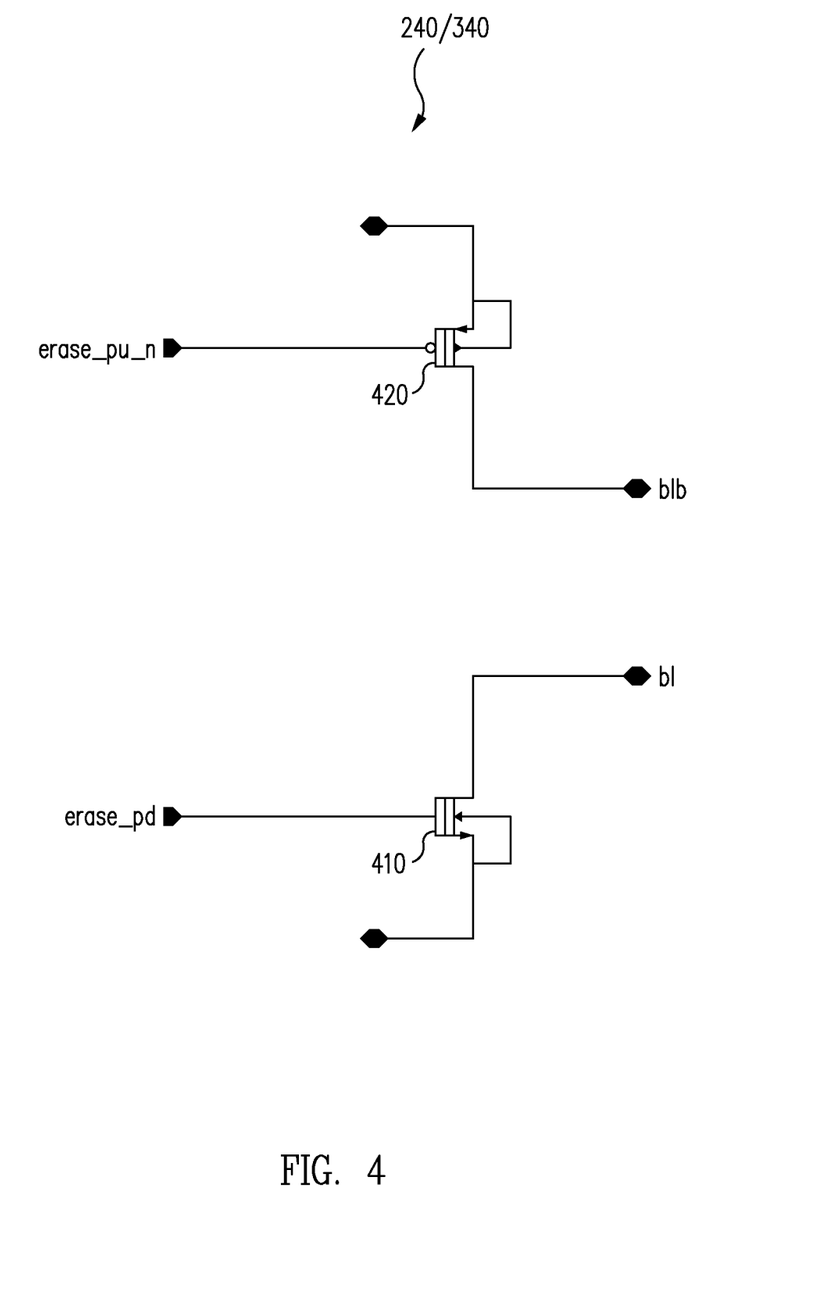
FIG. 4 illustrates a circuit implementation of an erase block in accordance with an embodiment of the invention.

FIG. 4 illustrates a circuit implementation of an erase block that may be used to provide erase block 240 of FIG. 2 or erase block 340 of FIG. 3 in accordance with an embodiment of the invention. Erase block 240 and erase block 340 may be used simultaneously to set bitlines bl and blb to desired pulled up or pulled down states during an erase operation.

Erase block 240/340 includes transistor 410 receiving signal erase_pd and connected to bitline bl, and also includes transistor 420 receiving signal erase_pu_n and connected to bitline blb. When signal cfg_por_erase_n is set to a logic high value (e.g., when an erase operation is not performed), signals erase_pd and erase_pu_n (provided by erase circuitry 250) are set to a logic low and logic high values, respectively. As a result, transistors 410 and 420 remain turned off.

When signal cfg_por_erase_n is set to a logic low value (e.g., when an erase operation is performed), signals erase_pd and erase_pu_n are set to logic high and logic low values, respectively. As a result, transistors 410 and 420 will turn on to pull down bitline bl and pull up bitline blb as part of an erase operation performed on SRAM cells 210.

Referring again to FIG. 2, write drivers 260/262 operate to selectively pull up or pull down bitlines bl and blb to write data values to SRAM cells 210. Write drivers 260/262 operate in response to signals pu_bl_n, pd_bl, pu_blb_n, and pd_blb which are provided by logic 270 in response to signals cfg_blin (e.g., a data signal providing data to be written into SRAM cells 210) and cfg_write (e.g., a write enable signal used to trigger a write operation). During the operation of write drivers 260/262, signals erase_pd and erase_pu_n (e.g., provided by erase circuitry 250 as discussed) are set to logic low and logic high values, respectively.

Logic 270 provides signals pu_bl_n, pd_bl, pu_blb_n, and pd_blb to write drivers 260/262 in response to signals cfg_blin and cfg_write in accordance with the following Table 2:

TABLE 2

| cfg_blin | cfg_write | pu_bl_n | pd_bl | pu_blb_n | pd_blb |
|---|---|---|---|---|---|
| 0 | 0 | 1 | 0 | 1 | 0 |
| 0 | 1 | 1 | 1 | 0 | 0 |
| 1 | 0 | 1 | 0 | 1 | 0 |
| 1 | 1 | 0 | 0 | 1 | 1 |

Figure 5:
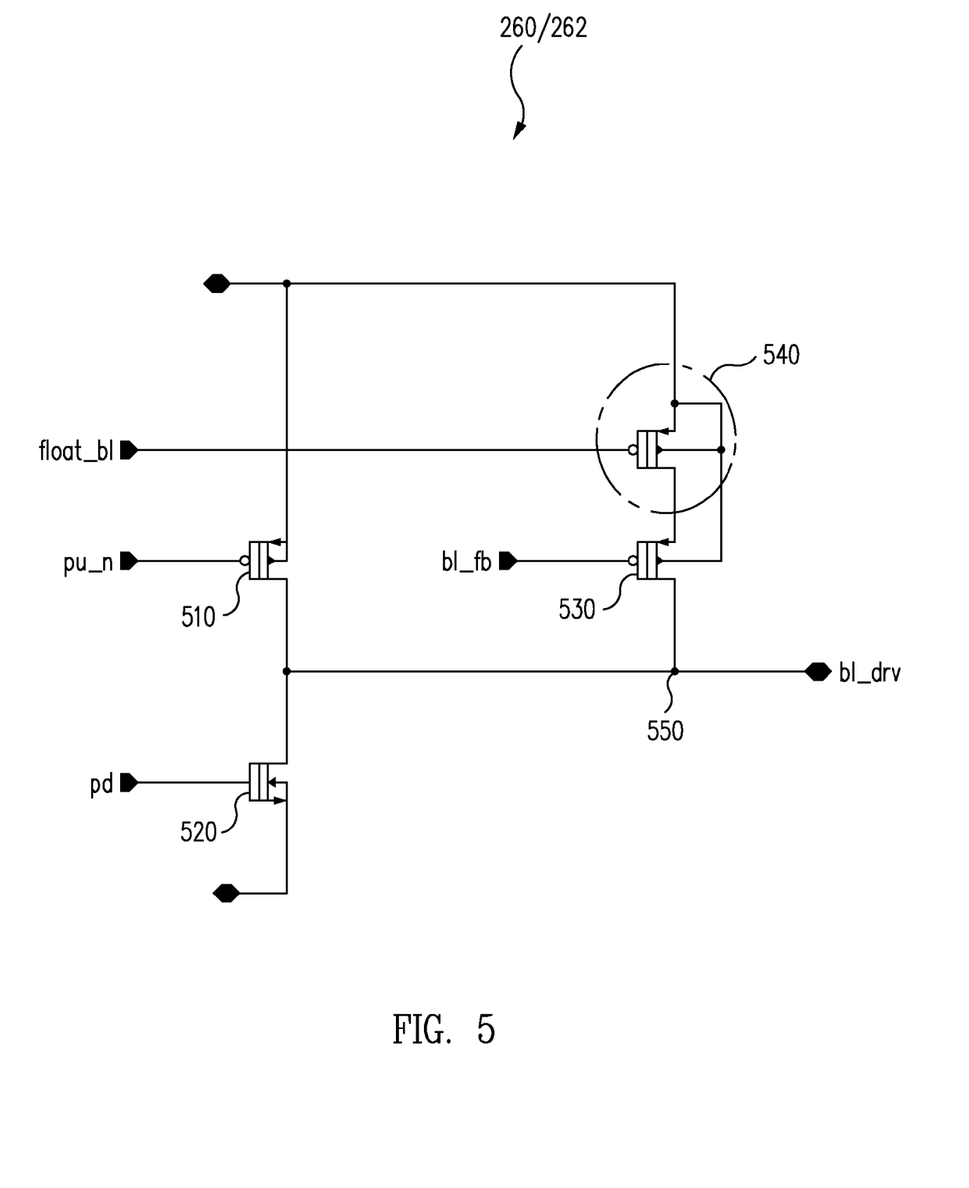
FIG. 5 illustrates a circuit implementation of a write driver in accordance with an embodiment of the invention.

FIG. 5 illustrates a circuit implementation of a write driver that may be used to provide write driver 260 or 262 in accordance with an embodiment of the invention.

Write driver 260/262 includes transistors 510, 520, 530, and 540. Transistors 510 and 520 may be used to provide a signal bl_drv to pull up or pull down a node 550 in response to signals pu_n and pd. In the case of write driver 260, signal pu_n is provided by signal pu_bl_n, signal pd is provided by signal pd_bl, and signal bl_drv is provided to bitline bl (see FIG. 2). In the case of write driver 262, signal pu_n is provided by signal pu_blb_n, signal pd is provided by signal pd_blb, and signal bl_drv is provided to bitline blb (see FIG. 2).

Transistor 530 is a cross-connected bitline pullup transistor that may be used to help adjust the voltage of bitline bl or blb during read operations. In this regard, transistor 530 receives a signal bl_fb which corresponds to a cross connected bitline. For example, in the case of write driver 260, a gate of transistor 530 is connected to bitline blb (see FIG. 2). In the case of write driver 262, a gate of transistor 530 is connected to bitline bl (see FIG. 2). Thus, if bitline bl or blb exhibits a logic low value during a read operation, the cross-connections of bitlines bl and blb to transistor 530 in write drivers 260 and 262 permit transistor 530 to turn on and help pull up (e.g., precharge) the other bitline bl or blb.

Transistor 540 may be used to selectively enable transistor 530 in response to signal float_bl. In this regard, while signal float_bl is set to a logic low value (e.g., in response to the operation of logic 230 on signals cfg_precharge and cfg_float_bl), transistor 540 turns on to permit transistor 530 to selectively pull up node 550 in response to signal bl_fb. However, while signal float_bl is set to a logic high value, transistor 540 turns off. As a result, transistor 530 will be disabled regardless of the value of signal bl_fb. Thus, signal float_bl may be used to reduce the power consumed by transistor 530, reduce leakage, and permit bitlines bl and blb to float when read and write operations are not being performed.

Referring again to FIG. 2, sense amplifier 280 operates to detect data values read from SRAM cells 210. In this regard, sense amplifier 280 may detect differential signals (e.g., differential voltages or currents) on bitlines bl and blb.

Sense amplifier 280 receives a signal cfg_rdbk_cap from logic 290 which may be used to trigger a detection by sense amplifier 280 at a desired time. In particular, sense amplifier 280 may be strobed by signal cfg_rdbk_cap after sufficient time has elapsed for differential data signals of sufficient magnitude and direction to develop (e.g., settle) on bitlines bl and blb. In this regard, logic 290 and configuration logic 110 may be implemented to delay signal cfg_rdbk_cap relative to wordline signal wl_str by a desired time period to permit the differential data signals to settle. As a result, the accuracy of data detected by sense amplifier 280 may be increased.

Figure 6:
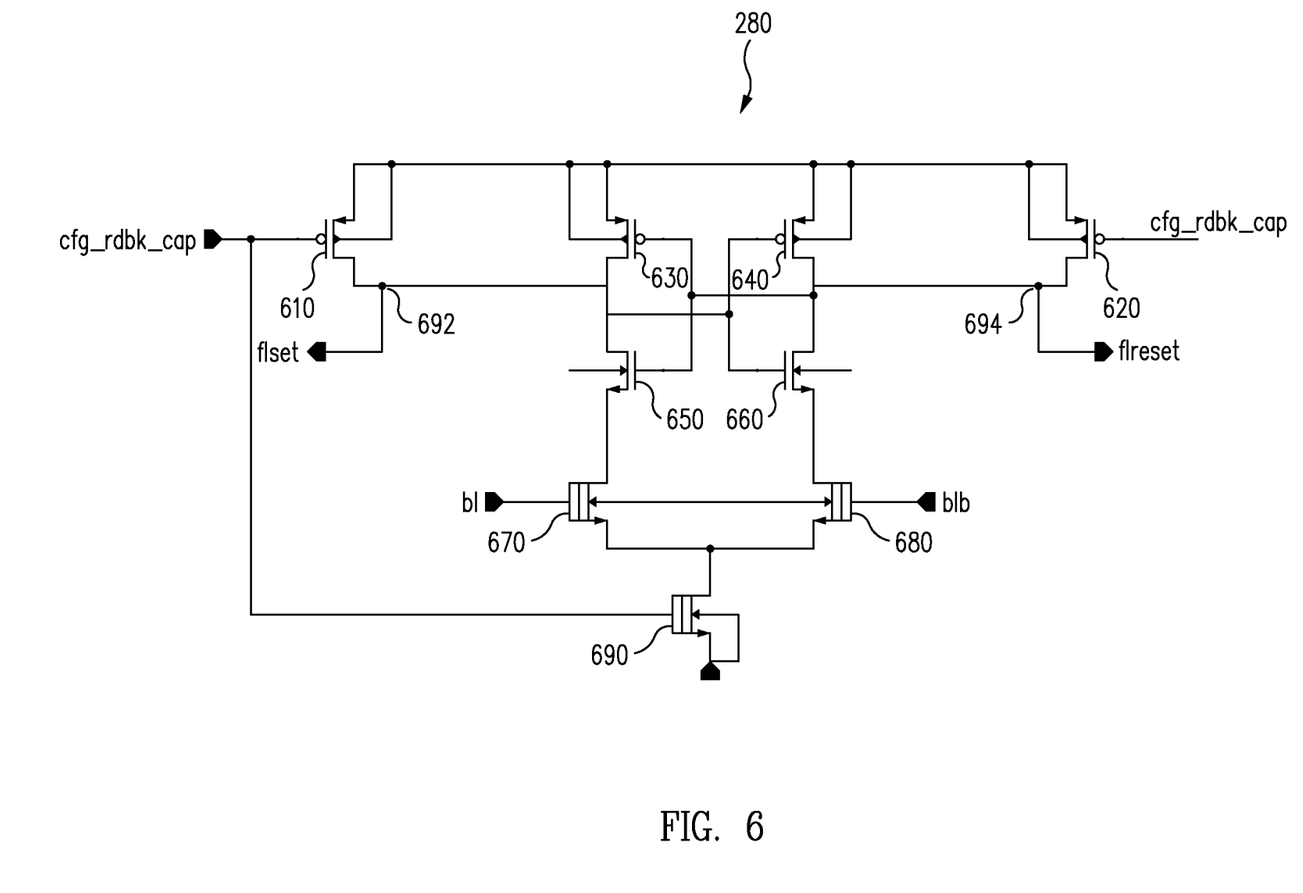
FIG. 6 illustrates a circuit implementation of a sense amplifier in accordance with an embodiment of the invention.

FIG. 6 illustrates a circuit implementation of sense amplifier 280 in accordance with an embodiment of the invention. Sense amplifier 280 includes transistors 610, 620, 630, 640, 650, 660, 670, 680, and 690.

As shown, signal cfg_rdbk_cap is provided to transistors 610, 620, and 690. In this regard, when signal cfg_rdbk_cap is set to a logic low value (e.g., when sense amplifier 280 is not detecting a data value from SRAM cells 210), transistors 610 and 620 turn on and transistor 690 turns off. As a result, the voltages at nodes 692 and 694 are pulled up through the operation of transistors 610 and 620. Meanwhile, because transistor 690 is turned off, there is no path to ground from transistors 630, 640, 650, 660, 670, and 680. As a result, changes in voltage or current on bitlines bl and blb will not affect nodes 692 and 694. Moreover, by turning off transistor 690, power savings can be realized over prior asynchronous sense amplifier designs employing constant current sources.

When signal cfg_rdbk_cap is set to a logic high value (e.g., when signal cfg_rdbk_cap is strobed to cause sense amplifier 280 to detect a data value from SRAM cells 210 at a desired time), transistors 610 and 620 turn off and transistor 690 turns on. As a result, the voltages at nodes 692 and 694 are no longer pulled up through the operation of transistors 610 and 620. Instead, the differential signals at bitlines bl and blb cause one of transistors 670 or 680 to turn on and the other to turn off. As a result, the voltage at one of nodes 692 or 694 will be pulled down in response to the operation of transistor 670 or 680. Transistors 630, 640, 650, and 660 effectively provide two cross-coupled inverters in a flip-flop configuration to pull up the voltage at other one of nodes 692 or 694. Thus, a differential voltage at nodes 692 and 694 corresponding to a detected data value may be provided from sense amplifier 280 to latch 295 through signals flset and flreset. As discussed, additional sense amplifiers 280 may be provided for additional pairs of bitlines bl and blb connected to additional SRAM cells 210.

Figure 7:
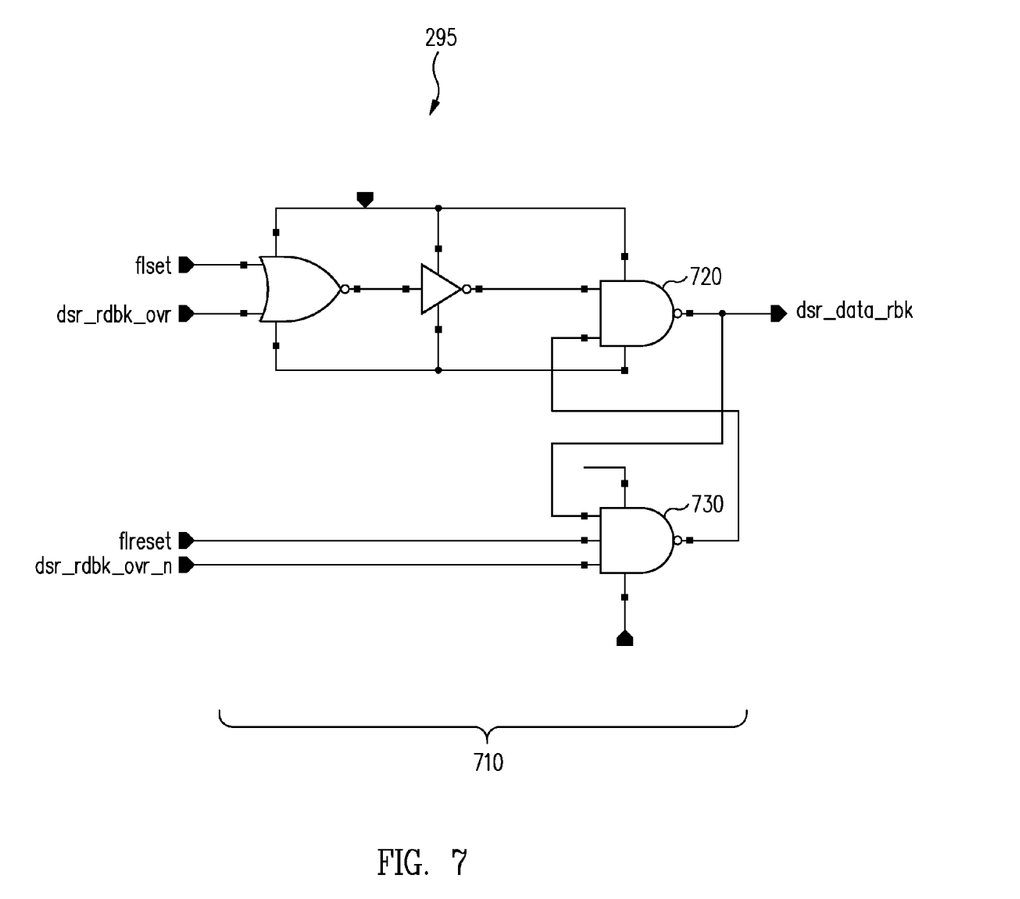
FIG. 7 illustrates a circuit implementation of a latch in accordance with an embodiment of the invention.

FIG. 7 illustrates a circuit implementation of latch 295 in accordance with an embodiment of the invention. As shown, latch 295 may be implemented by logic 710. Logic 710 receives signals flset and flreset from sense amplifier 280 which provide data values detected by sense amplifier 280. Logic may store such data values using cross-coupled NAND gates 720 and 730 configured as a set/reset NAND latch. Latch 295 also receives signals dsr_rdbk_ovr and dsr_rdbk_ovr_n which may be used to override the data value read out by latch 295 as signal dsr_data_rbk. In one embodiment, a value of 0 provided by signal dsr_data_rbk identifies an erased SRAM cell 210 (e.g., a default value), and a value of 1 provided by signal dsr_data_rbk identifies a programmed SRAM cell 210.

Logic 710 provides signal dsr_data_rbk in response to signals dsr_rdbk_ovr, dsr_rdbk_ovr_n, flset, flreset in accordance with the following Table 3:

TABLE 3

| dsr_rdbk_ovr | dsr_rdbk_ovr_n | flset | flreset | dsr_data_rbk |
| --- | --- | --- | --- | --- |
| 0 | 1 | 0 | 0 | X (not possible) |
| 0 | 1 | 0 | 1 | 1 |
| 0 | 1 | 1 | 0 | 0 |
| 0 | 1 | 1 | 1 | Previous dsr_data_rbk |
| 1 | 0 | 0 | 0 | X (not possible) |
| 1 | 0 | 0 | 1 | 0 |
| 1 | 0 | 1 | 0 | 0 |
| 1 | 0 | 1 | 1 | 0 |

Figure 8:
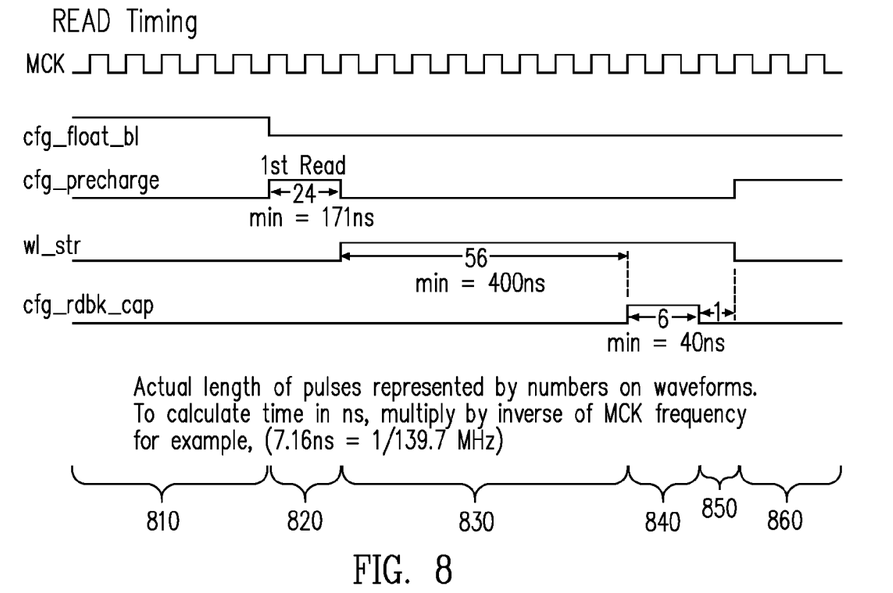
FIG. 8 illustrates signal plots associated with a read operation performed by memory control circuitry in accordance with an embodiment of the invention.

The operation of memory control circuitry 200 during read operations may be further understood with reference to the signal plots of FIG. 8. In this regard, FIG. 8 illustrates signal plots associated with a read operation performed by memory control circuitry 200 in accordance with an embodiment of the invention. In particular, FIG. 8 illustrates a clock signal MCK (e.g., provided by clock-related circuitry 108 of PLD 100), and signals cfg_float_bl, cfg_precharge, wl_str (e.g., one of signals wl_str(0) to wl_str(n)), and cfg_rdbk_cap identified in FIG. 2.

During a time period 810, memory control circuitry 200 operates in a power saving mode prior to performing a read operation. In this regard, while signal cfg_float_bl is set to a logic high value and signal cfg_precharge is set to a logic low value, logic 230 sets signal precharge_n to a logic high value (see Table 1). As a result, precharge block 220 floats bitlines bl and blb.

Also during time period 810, the logic high value of signal cfg_float_bl disables transistor 530 of write drivers 260/262 by turning off transistor 540. In this regard, signal cfg_float_bl passes through logic 240 to become signal float_bl_int which is received at write drivers 260/262 as signal float_bl.

Also during time period 810, wordline signal wl_str is set to a logic low value to prevent data values from being passed from SRAM cells 210 onto bitlines bl and blb. In addition, signal cfg_rdbk_cap is set to a logic low value to prevent sense amplifier 280 from reading data values from bitlines bl and blb.

During a time period 820, memory control circuitry 200 prepares for a read operation by precharging bitlines bl and blb. In this regard, signal cfg_float_bl transitions to a logic low value and signal cfg_precharge transitions to a logic high value. As a result, signal precharge_n transitions to a logic low value (see Table 1) and transistors 310, 320, and 330 of precharge block 220 operate to precharge bitlines bl and blb.

Also during time period 820, the logic low value of signal cfg_float_bl enables transistor 530 of write drivers 260/262 by turning on transistor 540. As a result, transistor 530 may operate to selectively pull up node 550 in response to signal bl_fb during the read operation.

During a time period 830 a read operation begins. Memory control circuitry 200 stops precharging bitlines bl and blb. In this regard, signal cfg_precharge transitions to a logic low value which causes signal precharge n to transition to a logic high value (see Table 1) which turns off transistors 310, 320, and 330 of precharge block 220.

Also during time period 830, signal wl_str transitions to a logic high value. As a result, access transistors of one of SRAM cells 210 turn on and permit the SRAM cell 210 to provide a stored data value to bitlines bl and blb.

Also during time period 830, signal cfg_rdbk_cap remains set to a logic low value to permit differential data signals provided by the SRAM cell 210 to build up on bitlines bl and blb before a data value is detected by sense amplifier 280.

During a time period 840, sense amplifier 280 detects the data value provided by the SRAM cell 210. In this regard, signal cfg_rdbk_cap transitions to a logic high value to trigger (e.g., strobe) sense amplifier 280 as previously discussed to detect the data value provided by differential data signals on bitlines bl and blb after the differential data signals have settled (e.g., reached final values). As discussed, sense amplifier passes the detected data value to latch 295 through signals flset and flreset.

During a time period 850, signal cfg_rdbk_cap transitions back to a logic low value to disable sense amplifier 280 in preparation for the next data read operation.

During a time period 860, memory control circuitry 200 prepares for the next data read operation by precharging bitlines bl and blb. In this regard, it will be appreciated that during time period 860 signals cfg_float_bl, cfg_precharge, wl_str, and cfg_rdbk_cap exhibit the same values as earlier time period 820. Thus, additional read operations may be performed by repeating time periods 820, 830, 840, and 850 until all desired SRAM cells 210 have been read. In this regard, different wordline signals wl_str (e.g., corresponding to different rows of SRAM cells 210) may be used in each iteration of such time periods to read data values from all rows of a column of SRAM cells 210.

Following the read operations, signal cfg_float_bl may return to a logic high value and signal cfg_precharge may remain at a logic low value to float bitlines bl and blb and disable transistor 530 of write drivers 260/262. As a result, memory control circuitry 200 may provide power savings when read operations are not performed.

Figure 9:
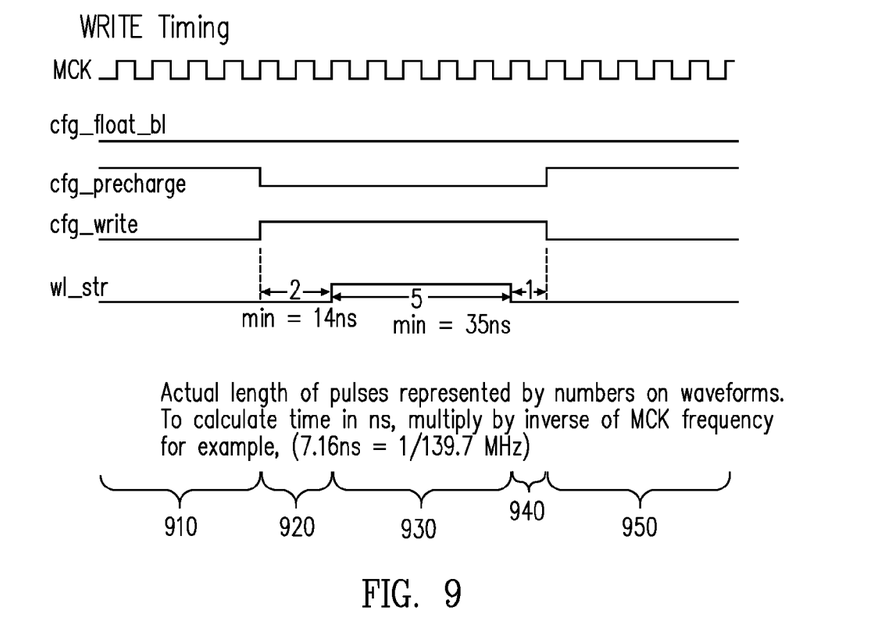
FIG. 9 illustrates signal plots associated with a write operation performed by memory control circuitry in accordance with an embodiment of the invention.

The operation of memory control circuitry 200 during write operations may be further understood with reference to the signal plots of FIG. 9. In this regard, FIG. 9 illustrates signal plots associated with a write operation performed by memory control circuitry 200 in accordance with an embodiment of the invention. In particular, FIG. 9 illustrates signals MCK, cfg_float_bl, cfg_precharge, cfg_write (also identified in FIG. 2), and wl_str.

During a time period 910, memory control circuitry 200 prepares for a write operation by precharging bitlines bl and blb. In this regard, signal cfg_float_bl transitions to a logic low value and signal cfg_precharge transitions to a logic high value to transition signal precharge_n to a logic low value to pull up bitlines bl and blb. In one embodiment, such precharging may be performed for 24 cycles of clock signal MCK before entering a time period 920.

Also during time period 910, the logic low value of signal cfg_float_bl enables transistor 530 of write drivers 260/262, and signal cfg_write remains set to a logic low value to disable transistors 510 and 520 of write drivers 260/262.

During a time period 920, memory control circuitry 200 begins a write operation and prepares to write a desired data value into a desired one of SRAM cells 210. In this regard, signal cfg_write transitions to a logic high value to cause write drivers 260/262 to drive bitlines bl and blb with differential data signals corresponding to a desired data value provided by signal cfg_blin (see Table 2). It will be appreciated that during time period 920, signal wl_str remains at a logic low value. This provides a time period for the differential data signals driven onto bitlines bl and blb to settle (e.g., to reach final values) before they are applied to write a data value into the SRAM cell 210.

Also during time period 920, signal cfg_precharge transitions to a logic low value to float bitlines bl and blb in relation to precharge block 220.

During a time period 930, signal wl_str transitions to a logic high value. As a result, the access transistors of one of SRAM cells 210 turn on to apply the differential signals from bitlines bl and blb to the SRAM cell 210 and thus write the desired data value into the SRAM cell 210.

During a time period 940, signal wl_str transitions back to a logic low value while configuration logic 110 of PLD shifts the next data value to be provided by signal cfg_blin.

During a time period 950, memory control circuitry 200 prepares for the next data write operation by precharging bitlines bl and blb. In this regard, it will be appreciated that during time period 950 signals cfg_float_bl, cfg_precharge, cfg_write, and wl_str exhibit the same values as earlier time period 910. Thus, additional write operations may be performed by repeating time periods 910, 920, 930, and 940 until all desired SRAM cells 210 have been written.

In one embodiment, different wordline signals wl_str (e.g., corresponding to different rows of SRAM cells 210) may be used in each iteration of such time periods to write data values to all rows of a column of SRAM cells 210. In another embodiment, multiple wordline signals wl_str may be used simultaneously to write the same data values into different rows of SRAM cells 210.

Following the write operations, signal cfg_float_bl may return to a logic high value and signal cfg_precharge may remain at a logic low value to float bitlines bl and blb and disable transistor 530 of write drivers 260/262. As a result, memory control circuitry 200 may also provide power savings when write operations are not performed.

In one embodiment, a bulk erase operation may be performed by operating the signals shown in FIG. 9, but without precharging. In this regard, time periods 910 and 950 may be omitted, and time periods 920, 930, and 940 may be repeated for each row of SRAM cells 210 (e.g., to erase all SRAM cells 210 of a column).

In view of the present disclosure, it will be appreciated that memory control circuitry 200 may be used to float bitlines bl and blb relative to precharge block 220 at all times except immediately prior to read and write operations as discussed with regard to FIGS. 8 and 9. As a result, power savings may be realized. Memory control circuitry 200 may realize additional power savings by disabling transistor 530 at all times except immediately prior to read and write operations.

It will be further appreciated that data values may be read with improved accuracy by triggering sense amplifier 280 to read data values at synchronized times. Such timing permits differential bitline signals to develop and settle at substantially final values before a detection is performed. As a result, data may be detected with improved accuracy. Also, by keeping transistor 690 of sense amplifier 280 turned off (e.g., except when strobed for read operations), power savings can be realized over prior asynchronous sense amplifier designs employing constant current sources.

Embodiments described above illustrate but do not limit the invention. It should also be understood that numerous modifications and variations are possible in accordance with the principles of the invention. Accordingly, the scope of the invention is defined only by the following claims.

We claim:
1. A programmable logic device (PLD) comprising:
   a plurality of static random access memory (SRAM) cells adapted to configure the PLD for an intended use;
   a pair of bitlines connected to the SRAM cells, wherein at least one of the SRAM cells is adapted to provide data signals to the bitlines in response to a wordline signal received by the one of the SRAM cells during a read operation;
   a sense amplifier connected to the bitlines and adapted to detect a data value from the data signals in response to a trigger signal received by the sense amplifier during the read operation; and
   logic adapted to delay the trigger signal relative to the wordline signal to permit the data signals to settle before the sense amplifier detects the data value,
   wherein the logic includes at least first and second inverters connected in series, an input of the first inverter coupled to receive the trigger signal and an output of the second inverter coupled to provide the delayed trigger signal to the sense amplifier, and
   wherein the sense amplifier comprises:
      a flip flop comprising first and second nodes;
      a first transistor having its gate connected to a first one of the bitlines; and
      a second transistor having its gate connected to a second one of the bitlines, wherein the first and second transistors are adapted to selectively adjust voltages of the first and second nodes, respectively, in response to the data signals on the bitlines when the trigger signal is received.

2. The PLD of claim 1, further comprising a latch connected to the sense amplifier and adapted to store the data value detected by the sense amplifier.

3. The PLD of claim 1, wherein the sense amplifier comprises a third transistor coupled to receive the trigger signal and adapted to provide a path from the flip flop to a ground when the trigger signal is received.

4. The PLD of claim 1, wherein the sense amplifier comprises third and fourth transistors coupled to receive the trigger signal and adapted to provide the data value detected by the flip flop when the trigger signal is received.

5. The PLD of claim 1, wherein the SRAM cells are a first plurality of SRAM cells, the pair of bitlines is a first pair of bitlines, the data signals are first data signals, the sense amplifier is a first sense amplifier, and the data value is a first data value, the PLD further comprising:
a second plurality of SRAM cells adapted to further configure the PLD for the intended use;
a second pair of bitlines connected to the second SRAM cells, wherein at least one of the second SRAM cells is adapted to provide second data signals to the second bitlines in response to the wordline signal received by the one of the second SRAM cells during the read operation; and
a second sense amplifier connected to the second bitlines and adapted to detect a second data value from the second data signals in response to the trigger signal received by the second sense amplifier during the read operation.

6. The PLD of claim 1, further comprising a precharge circuit connected to the bitlines and adapted to float relative to the bitlines during a power saving mode, precharge the bitlines immediately prior to the read operation before data from the one of the SRAM cells is provided to the bitlines, and float relative to the bitlines during the read operation while the data from the one of the SRAM cells is provided to the bitlines.

7. The PLD of claim 6, wherein the precharge circuit is adapted to precharge the bitlines immediately prior to a write operation before data to be written into the one of the SRAM cells is provided to the bitlines, and float relative to the bitlines during the write operation while the data is provided to the SRAM cell through the bitlines.

8. The PLD of claim 1, wherein the data signals are differential data signals.

9. The PLD of claim 1, wherein the SRAM cells and the bitlines are distributed throughout the PLD.

10. A memory circuit comprising:
a plurality of static random access memory (SRAM) cells;
a pair of bitlines connected to the SRAM cells, wherein at least one of the SRAM cells is adapted to provide data signals to the bitlines in response to a wordline signal received by the one of the SRAM cells during a read operation;
a sense amplifier connected to the bitlines and adapted to detect a data value from the data signals in response to a trigger signal received by the sense amplifier during the read operation; and
logic adapted to delay the trigger signal relative to the wordline signal to permit the data signals to settle before the sense amplifier detects the data value,
wherein the logic includes at least first and second inverters connected in series, an input of the first inverter coupled to receive the trigger signal and an output of the second inverter coupled to provide the delayed trigger signal to the sense amplifier, and
wherein the sense amplifier comprises:
a flip flop comprising first and second nodes;
a first transistor having its gate connected to a first one of the bitlines; and
a second transistor having its gate connected to a second one of the bitlines,
wherein the first and second transistors are adapted to selectively adjust voltages of the first and second nodes, respectively, in response to the data signals on the bitlines when the trigger signal is received.

11. The memory circuit of claim 10, further comprising a latch connected to the sense amplifier and adapted to store the data value detected by the sense amplifier.

12. The memory circuit of claim 10, wherein the sense amplifier comprises a third transistor coupled to receive the trigger signal and adapted to provide a path from the flip flop to a ground when the trigger signal is received.

13. The memory circuit of claim 10, wherein the sense amplifier comprises third and fourth transistors coupled to receive the trigger signal and adapted to provide the data value detected by the flip flop when the trigger signal is received.

14. The memory circuit of claim 10, further comprising a precharge circuit connected to the bitlines and adapted to float relative to the bitlines during a power saving mode, precharge the bitlines immediately prior to the read operation before data from the one of the SRAM cells is provided to the bitlines, and float relative to the bitlines during the read operation while the data from the one of the SRAM cells is provided to the bitlines.

15. The memory circuit of claim 14, wherein the precharge circuit is adapted to precharge the bitlines immediately prior to a write operation before data to be written into the one of the SRAM cells is provided to the bitlines, and float relative to the bitlines during the write operation while the data is provided to the SRAM cell through the bitlines.

16. The memory circuit of claim 10, wherein the data signals are differential data signals.

17. A circuit comprising:
a plurality of static random access memory (SRAM) cells;
a pair of bitlines connected to the SRAM cells, wherein at least one of the SRAM cells is adapted to provide data signals to the bitlines in response to a wordline signal received by the one of the SRAM cells during a read operation;
a sense amplifier connected to the bitlines and adapted to detect a data value from the data signals in response to a trigger signal received by the sense amplifier during the read operation; and
logic adapted to delay the trigger signal a predetermined time period relative to the wordline signal to permit the data signals to settle before the sense amplifier detects the data value.

18. The circuit of claim 17 including a precharge circuit connected to the bitlines and adapted to float relative to the bitlines during a power saving mode, precharge the bitlines immediately prior to the read operation before data from the one of the SRAM cells is provided to the bitlines, and float relative to the bitlines during the read operation while the data from the one of the SRAM cells is provided to the bitlines.

19. The circuit of claim 18, wherein the precharge circuit is adapted to precharge the bitlines immediately prior to a write operation before data to be written into the one of the SRAM cells is provided to the bitlines, and float relative to the bitlines during the write operation while the data is provided to the SRAM cell through the bitlines.

20. The circuit of claim 17, wherein the logic includes at least first and second inverters connected in series, an input of the first inverter coupled to receive the trigger signal and an output of the second inverter coupled to provide the delayed trigger signal to the sense amplifier.

21. The circuit of claim 20, wherein the first inverter has a single data input and the second inverter has a single data input coupled to an output of the first inverter.

* * * * *